(12) United States Patent
Gronlund

(10) Patent No.: US 7,746,679 B2
(45) Date of Patent: Jun. 29, 2010

(54) RANGE CHECKING CONTENT ADDRESSABLE MEMORY ARRAY

(75) Inventor: Christopher Gronlund, Kent, WA (US)

(73) Assignee: Broadcom Corporation, Irvine, CA (US)

( * ) Notice: Subject to any disclaimer, the term of this patent is extended or adjusted under 35 U.S.C. 154(b) by 176 days.

(21) Appl. No.: 12/217,386

(22) Filed: Jul. 3, 2008

(65) Prior Publication Data

US 2010/0002483 A1   Jan. 7, 2010

(51) Int. Cl.
*G11C 15/00* (2006.01)
(52) U.S. Cl. .................. 365/49.17; 365/49.1; 365/49.15
(58) Field of Classification Search ............... 365/49.15
See application file for complete search history.

(56) References Cited

U.S. PATENT DOCUMENTS 6,512,684 B2 * 1/2003 Gordon et al. ........... 365/49.15
6,898,099 B1 * 5/2005 Srinivasan et al. ....... 365/49.15

\* cited by examiner

*Primary Examiner*—Tan T. Nguyen
(74) *Attorney, Agent, or Firm*—Farjami & Farjami LLP

(57) ABSTRACT

A disclosed embodiment is a range checking CAM array comprising a plurality of words, where each of the plurality of words comprises a plurality of bound check cells. Each of the plurality of bound check cells outputs a corresponding plurality of match signals and a corresponding plurality of bound check signals. The corresponding plurality of match signals and corresponding plurality of bound check signals are combined to produce a range check output indicating whether data on a data input bus is within a target range. The plurality of bound check cells may be coupled to form at least one cascade of bound check cells, where each cascade of bound check cells may be terminated at a ripple logic. The CAM array produces a final range check output based on the corresponding plurality of match signals and the corresponding plurality of bound check signals.

20 Claims, 4 Drawing Sheets

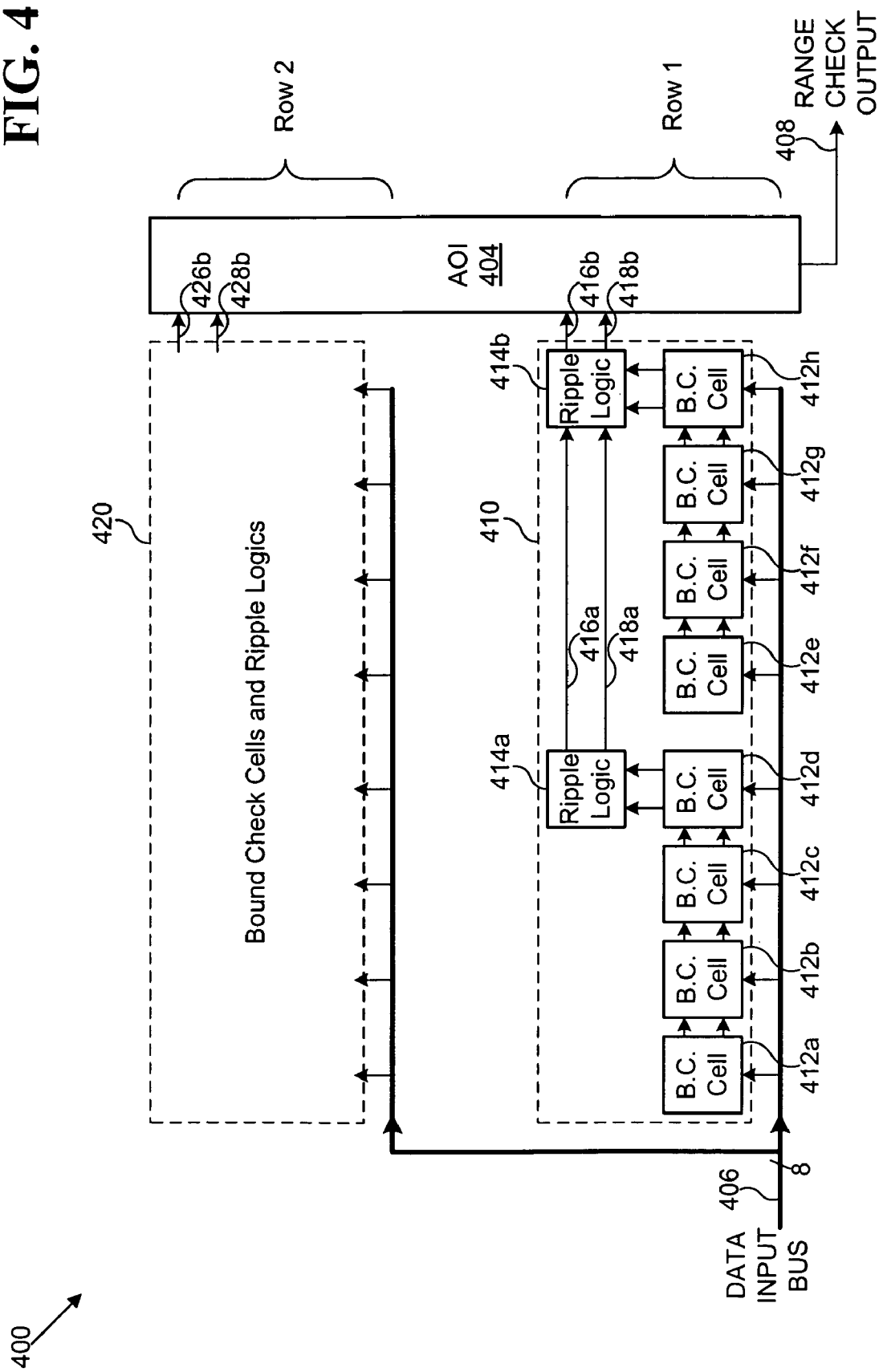

RANGE CHECKING CONTENT ADDRESSABLE MEMORY ARRAY

BACKGROUND OF THE INVENTION

1. Field of the Invention

The present invention is generally in the field of memory arrays. More particularly, the present invention relates to content addressable memory arrays.

2. Background Art

A conventional CAM (content addressable memory) array typically operates by comparing data on an input data bus (the "compare data") to data in every word (the "stored data") in the CAM array quickly, e.g. in one hardware operation, and outputting the address of a word storing matching data, if such a word exists. Conventional CAM arrays are thus useful in certain high-speed applications that search for equality between compare data and stored data. By reconfiguring a conventional CAM array, the CAM array can alternatively be utilized for range checking applications.

CAM arrays configured for range checking applications do not search for equality between compare data and stored data, but instead determine whether compare data has a value in a target range between two values represented by stored data. Utilizing a conventional CAM array to perform range checking operations has several drawbacks. A conventional CAM array can be configured for a range checking application by storing every value in the range in the conventional CAM array and adding additional range checking circuits. If compare data is equal to any value in the range stored in the conventional CAM array, the additional range checking circuits can signal a range-match condition on a range check output. Configuring the conventional CAM array to perform a range checking operation as described has a high area cost associated with storing the entire range, and the width of the range is limited by the number of words in the conventional CAM array, thereby limiting flexibility.

Thus, there is a need in the art for a CAM array that overcomes disadvantages associated with using conventional CAM arrays for range checking and bound checking applications.

SUMMARY OF THE INVENTION

A range checking CAM (content addressable memory) array, substantially as shown in and/or described in connection with at least one of the figures, and as set forth more completely in the claims.

BRIEF DESCRIPTION OF THE DRAWINGS

FIG. 4 shows an exemplary range checking CAM array, according to one embodiment of the present invention.

DETAILED DESCRIPTION OF THE INVENTION

The present invention is directed to a range checking CAM (content addressable memory) array. Although the invention is described with respect to specific embodiments, the principles of the invention, as defined by the claims appended herein, can obviously be applied beyond the specific embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
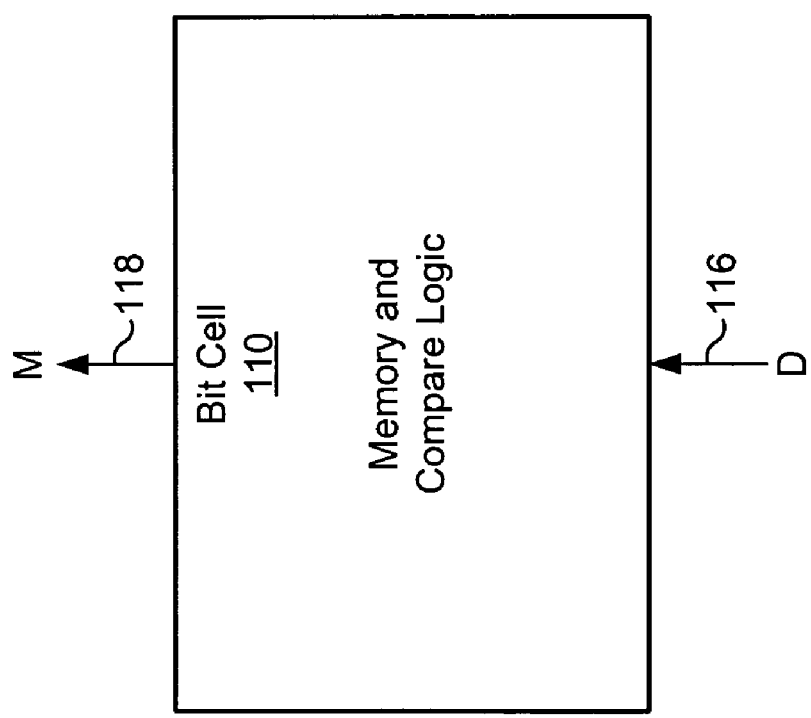
FIG. 1 shows an example of a conventional CAM (content addressable memory) array bit cell.

A conventional CAM (content addressable memory) bit cell 110 is shown in FIG. 1. Bit cell 110 comprises a memory and a compare logic, is coupled to D 116, which provides an input to bit cell 110, and is coupled to M 118, which is an output of bit cell 110. A plurality of bit cells are utilized to fabricate conventional CAM array 200, as shown in FIG. 2 and described further below.

The memory of bit cell 110 stores one data bit, and can be implemented as, for example, a conventional 6-transistor memory circuit, comprising cross-coupled inverters and a pair of transmission gate transistors (not shown). Various implementations of the memory may use alternative memory circuits as known in the art. The compare logic of bit cell 110 can be implemented as, for example, a conventional pull-down circuit configured to pull down a charge or voltage on M 118 if and only if a logical value stored in the memory of bit cell 110 does not match a logical value on D 116. Alternatively, the compare logic may use another comparison circuit as known in the art. In operation, a bit s stored in the memory of bit cell 110 is compared to a bit on D 116 by the compare logic of bit cell 110, which indicates the result of the comparison via M 118.

Figure 2:
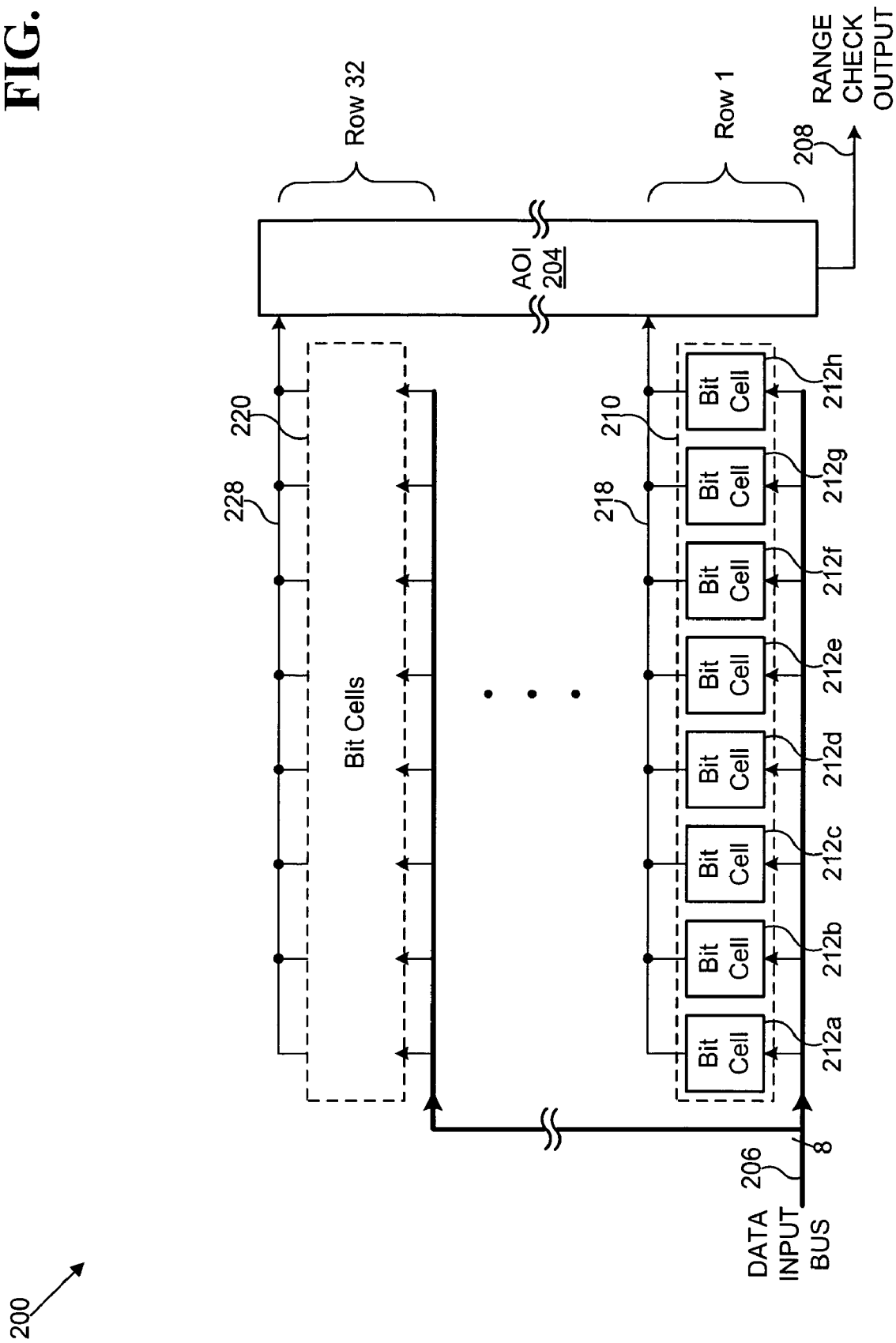
FIG. 2 shows an example of a conventional CAM array.

An exemplary conventional CAM (content addressable memory) array 200 configured to perform a range checking operation is shown in FIG. 2. During a range checking operation, CAM array 200 determines whether the data on data input bus 206 (the "compare data") has a value in a range between two values stored in words of CAM array 200. In the present example, the words of CAM array 200 are arranged in 32 rows, of which only the first (row 1, comprising word 210) and last (row 32, comprising word 220) are shown. Intermediate rows 2 through 31 are not shown in FIG. 2, and are understood to be configured in a manner similar to rows 1 and 32, as understood by those of ordinary skill in the art. Each word of CAM array 200 is coupled to data input bus 206 and a respective match line. For example, word 210 is coupled to data input bus 206 and match line 218, and word 220 is coupled to data input bus 206 and match line 228. Data input bus 206 comprises 8 bit lines, and each of the match lines (e.g., match lines 218 and 228) comprises a single line coupled to And Or Inverter logic 204 (also referred to as "AOI 204" for ease of reference).

Word 210 comprises bit cells 212a, 212b, 212c, 212d, 212e, 212f, 212g, and 212h ("bit cells 212a through 212h"). Each of bit cells 212a through 212h corresponds to bit cell 110 in FIG. 1, and thus each of bit cells 212a through 212h comprises an input corresponding to D 116, an output corresponding to M 118, and a memory and a compare logic. The input and output of each of bit cells 212a through 212h is shown coupled to a respective bit line of data input bus 206 and to match line 218. Like word 210, word 220 contains 8 bit cells (not shown) coupled to respective bit lines of data input bus 206 and to match line 228. The bit cells of the omitted words in row 2 through row 31 are similarly coupled to respective bit lines of data input bus 206 and to respective match lines.

Prior to performing a range checking operation, CAM array 200 is configured to store a range, which in this example is defined as a sequence of consecutive integers. Thus, to configure CAM array 200, the lower range boundary is stored in word 210 in row 1, the upper range boundary is stored in word 220 in row 32, and the intermediate values in the range are stored in the intermediate words in rows 2 through 31. For example, the words in rows 1 through 32 can store the consecutive integers 33 through 64. Notably, CAM array 200 is thus configured to store a range that is 32 integers wide, but in another configuration CAM array 200 could be configured to store, for example, two ranges that are 16 integers wide, e.g. the words in rows 1 through 16 could store the consecutive integers 33 through 48, and the words in rows 17 through 32 could store the consecutive integers 65 through 80. Various implementations of conventional range checking CAMs can thus be configured to store an arbitrary amount of ranges of arbitrary width, provided that the range checking CAM has enough rows.

After a range is stored in CAM array 200, e.g. after the words of CAM array 200 store the consecutive integers 33 through 64, a range checking operation can be performed. In one example, to begin the range checking operation, AOI 204 precharges the respective match lines coupled to each word of CAM array 200. Subsequently, data input bus 206 carries the compare data to each word of CAM array 200 simultaneously. If the 8 bits of the compare data are equal to the 8 bits stored in a word, the word allows the coupled match line to remain charged, i.e. the word does not pull down the coupled match line. If the 8 bits of the compare data are not so equal, the word pulls the coupled match line down. For example, if the compare data is the integer 33, word 210 will not pull down match line 218, and the match lines coupled to words in rows 2 through 32 will be pulled down. In contrast, if the compare data is an integer lower than 33, or higher than 64, all of the match lines will be pulled down.

To conclude a range-checking operation, range checking circuits in AOI 204 determine whether any of the precharged match lines in rows 1 through 32 still maintain a charge. If not, then none of the words stored data equal to the compare data carried by data input bus 206. AOI 204 then outputs a logical 0 on range check output 208, indicating that the compare data was outside the range. In contrast, if one of the precharged match lines still maintains a charge, then the compare data was inside the range, and AOI 204 outputs a logical 1 on range check output 208.

Thus, configuring conventional CAM array 200 for a range checking application requires storing the entire range in the words of CAM array 200, and requires utilizing range checking circuits in AOI 204. Configuring a conventional CAM array in this manner has a high area cost associated with storing the entire range, because the amount of words utilized grows with the width of the range. Additionally, the width of the range is ultimately limited by the number of words in CAM array 200, thereby limiting flexibility.

Figure 3:
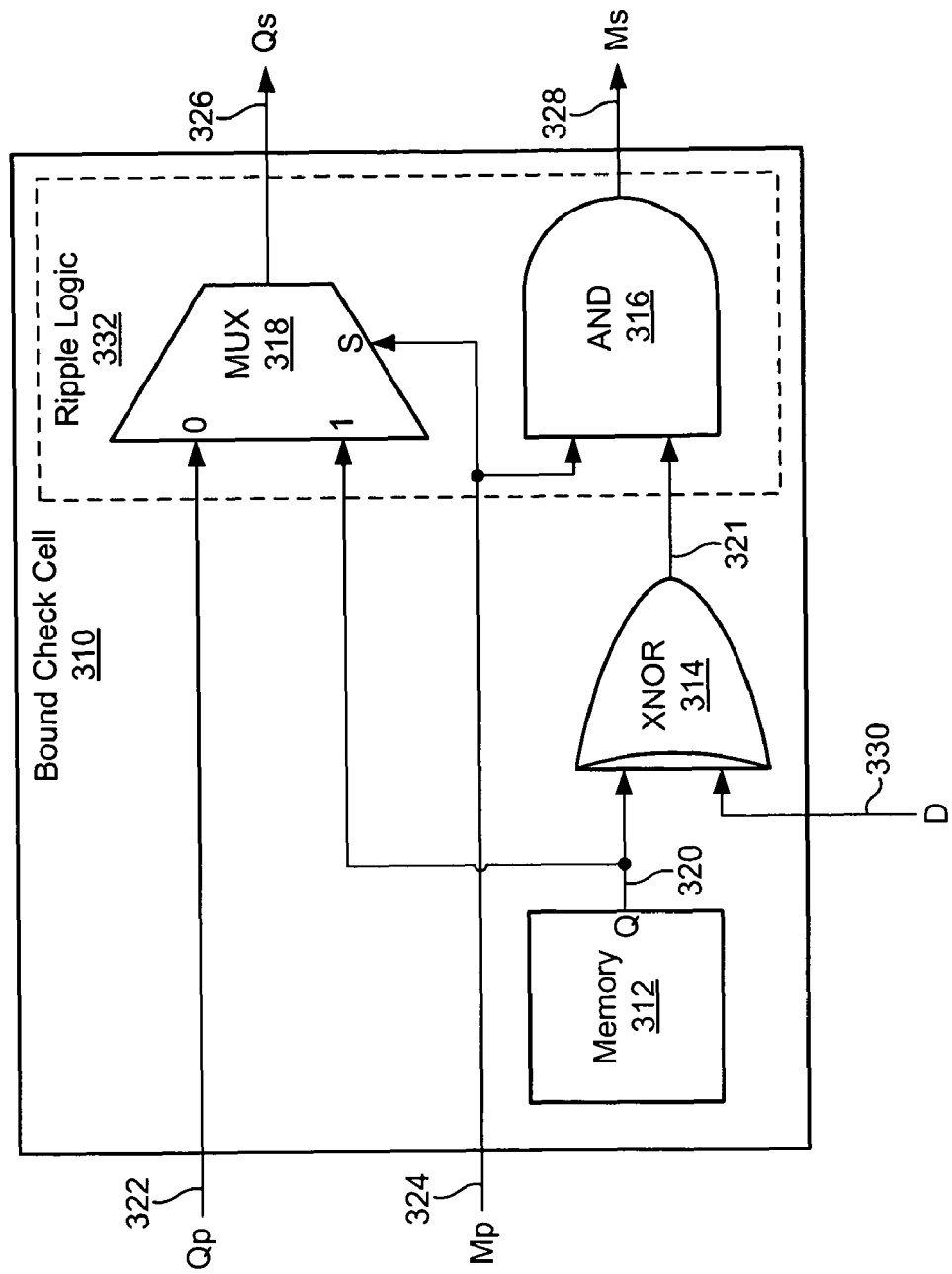
FIG. 3 shows an exemplary range checking CAM array bound check cell, according to one embodiment of the present invention.

A CAM (content addressable memory) bound check cell 310, according to one embodiment of the present invention, is shown in FIG. 3. Bound check cell 310 comprises memory 312, XNOR 314, AND 316, and MUX 318. The latter two components, AND 316 and MUX 318, make up ripple logic 332 of bound check cell 310. Bound check cell 310 is coupled to three inputs, D 330 (a "data bit"), Qp 322 (a "previous bound check signal"), and Mp 324 (a "previous match signal"). Bound check cell 310 is additionally coupled to two outputs, Qs 326 (a "subsequent bound check signal") and Ms 328 (a "subsequent match signal"). A plurality of bound check cells are utilized to fabricate range checking CAM array 400 according to one embodiment of the invention, as shown in FIG. 4 and described further below.

In one embodiment of bound check cell 310, memory 312 is implemented as a 6-transistor memory circuit that stores one data bit. Other embodiments may implement memory 312 with alternative memory circuits as known in the art. Line 320 carries the output of memory 312 to XNOR 314 (line 320 is also coupled to the "1" input of MUX 318, as discussed further below). XNOR 314, in addition to being coupled to line 320, is coupled to D 330. XNOR 314 calculates an "exclusive-nor" logical function on the values on line 320 and D 330 to produce an output on line 321. Thus, line 321 has a logical 0 value if the data bit stored in memory 312 is not equal to the data bit value on D 330, and has a logical 1 value if the data bits are equal.

Line 321 carries the output of XNOR 314 to an input of AND 316. AND 316 is additionally coupled to the previous match signal Mp 324. AND 316 calculates an "and" logical function on the values on line 321 and on Mp 324 to produce an output on subsequent match signal Ms 328. Thus, Ms 328 has a logical 0 value if the previous match signal Mp 324 has a logical 0 value, or if the data bit stored in memory 312 is not equal to the data bit value on D 330. Otherwise, Ms 328 has a logical 1 value.

Previous match signal Mp 324, in addition to being coupled to AND 316, is coupled to the selector input "S" of MUX 318. As stated above, line 320 carrying the data bit stored in memory 312 is coupled to the "1" input of MUX 318. Additionally, the previous bound check signal Qp 322 is coupled to the "0" input of MUX 318. MUX 318 performs a selection function as known in the art. MUX 318 selects for output on subsequent bound check signal Qs 326 either input "0" or "1" depending on the value on input "S." Thus, either Qs 326 carries the data bit stored in memory 312 if previous match signal Mp 324 has a logical 1 value, or Qs 326 carries the logical value on previous bound check signal Qp 322 if Mp 324 has a logical 0 value.

Ripple logic 332, comprising AND 316 and MUX 318, is depicted as an internal component of bound check cell 310 in FIG. 3. In some embodiments of the invention, ripple logic 332 can also be utilized as an independent subcircuit in a range checking CAM array. For example, range checking CAM array 400 is fabricated with a plurality of bound check cells corresponding to bound check cell 310, as well as with a plurality of ripple logics corresponding to ripple logic 332, as described below.

A range checking CAM (content addressable memory) array, according to one embodiment of the present invention, is shown in FIG. 4 as CAM array 400. During a range checking operation, CAM array 400 determines whether the data on data input bus 406 (the "compare data") has a value in a range between two values stored in words of CAM array 400. In the present example, CAM array 400 comprises two bound checking CAM array words, as described below, and is an example of a range checking CAM array configured according to the present invention to check a single range. So configured, CAM array 400 is used herein to describe the novel concepts of the present invention in order to preserve brevity and for ease of discussion. However, it is understood by those of ordinary skill in the art that the novel concepts explained in relation to CAM array 400, configured in the present exemplary embodiment to check a single range, can be easily extended and applied to a range checking CAM array configured to check a plurality of ranges.

In the present example, CAM array 400 comprises a plurality of bound checking CAM array words, i.e. words 410 and 420, which are in rows 1 and 2, respectively. Words 410 and 420 are coupled to data input bus 406, and each word outputs a respective subsequent bound check signal and subsequent match signal. For example, word 410 is coupled to data input bus 406 and outputs subsequent bound check signal 416b and subsequent match signal 418b. Data input bus 406 comprises 8 bit lines, while subsequent bound check signal 416b and subsequent match signal 418b each comprise a single line coupled to And Or Inverter logic 404 (also referred to as "AOI 404" for ease of reference). Word 420 is similarly coupled to data input bus 406 and outputs subsequent bound check signal 426b and subsequent match signal 428b to AOI 404.

Word 410 comprises two pluralities of bound check cells, bound check cells 412a, 412b, 412c, and 412d, ("bound check cells 412a through 412d"), and bound check cells 412e, 412f, 412g, and 412h ("bound check cells 412e through 412h"). Word 410 additionally comprises ripple logics 414a and 414b. Each of bound check cells 412a through 412d and 412e through 412h corresponds to bound check cell 310 in FIG. 3. Thus, each bound check cell in word 410 comprises three inputs corresponding to Qp 322, Mp 324, and D 330, as well as two outputs corresponding to Qs 326 and Ms 328. Each input of the bound check cells corresponding to D 330 is coupled to a respective data bit line of data input bus 406. The remaining inputs and outputs are devoted to coupling bound check cells 412a through 412d in a cascade terminating at ripple logic 414a, and to coupling bound check cells 412e through 412h in a cascade terminating at ripple logic 414b, as shown in FIG. 4.

The inputs of bound check cells 412a and 412e corresponding to Qp 322 and Mp 324 are not shown, but are coupled to default signals, as described below. The inputs of bound check cells 412b, 412c, and 412d corresponding to Qp 322 and Mp 324 are coupled, respectively, to the outputs of bound check cells 412a, 412b, and 412c corresponding to Qs 326 and Ms 328. Similarly, the inputs of bound check cells 412f, 412g, and 412h corresponding to Qp 322 and Mp 324 are coupled, respectively, to the outputs of bound check cells 412e, 412f, and 412g corresponding to Qs 326 and Ms 328. The outputs of bound check cells 412d and 412h corresponding to Qs 326 and Ms 328 are coupled to the inputs of ripple logics 414a and 414b, respectively, as described further below.

Ripple logics 414a and 414b each correspond to ripple logic 332 in FIG. 3. Thus, each ripple logic in word 410 comprises four inputs corresponding to line 321, Mp 324, line 320, and Qp 322, as well as two outputs corresponding to Qs 326 and Ms 328. The inputs of ripple logics 414a and 414b corresponding to line 320 are coupled to the outputs of bound check cells 412d and 412h, respectively, corresponding to subsequent bound check signal Qs 326. The inputs of ripple logics 414a and 414b corresponding to line 321 are coupled to the outputs of bound check cells 412d and 412h, respectively, corresponding to subsequent match signal Ms 328. The remaining inputs and outputs of ripple logics 414a and 414b are devoted to coupling ripple logics 414a and 414b in a cascade terminating at the outputs of word 410, i.e. at subsequent bound check signal 416b and subsequent match signal 418b. The inputs of ripple logic 414a corresponding to Qp 322 and Mp 324 are not shown, but are coupled to default signals, in a manner similar to the coupling of inputs of bound check cells 412a and 412e to default signals.

The internal configuration of word 420 corresponds to that of word 410, e.g. word 420 comprises two pluralities of cascaded bound check cells, each terminating in a ripple logic, where the two ripple logics are coupled in a cascade terminating at outputs subsequent bound check signal 426b and subsequent match signal 428b. To preserve brevity and for ease of discussion, the internal configuration of word 420 is omitted from FIG. 4. Having thus described the internal configurations of words 410 and 420, and the manner of coupling data input bus 406, words 410 and 420, and AOI 404, the operation of CAM array 400 may now be described.

Prior to performing a range checking operation, CAM array 400 is configured to store a range, which in this exemplary embodiment of the invention is defined as a sequence of consecutive integers between upper and lower range boundaries, inclusive. Other embodiments may define a range differently provided that the defined range can be represented in a binary format and stored in bound checking CAM array words according to the invention. To store a range in CAM array 400, the lower range boundary is stored in word 410 in row 1, and the upper range boundary is stored in word 420 in row 2. Notably, only two words are required to store the range, and no intermediate values in the range need to be stored.

For example, a single range between upper and lower range boundaries 101 and 200 can be stored in CAM array 400 by storing the value 101 in word 410 and the value 200 in word 420. In another embodiment of the invention comprising, for example, four words, instead of two words, CAM array 400 could be configured to store two ranges. Notably, the width of the range stored does not depend on the number of words in CAM array 400. For example, as presently configured CAM array 400 stores a range that is 100 integers wide, but in another configuration, e.g. by storing the value 0 in word 410 and the value 200 in word 420, CAM array 400 can store a range that is 201 integers wide. The width of a range stored in a range checking CAM array according to the invention is thus limited only by the maximum and minimum values that can be stored in the words.

After a range is stored in CAM array 400, e.g. after words 410 and 420 store the values 101 and 200, respectively, a range checking operation can be performed. To begin the range checking operation, data input bus 406 carries the compare data to words 410 and 420 simultaneously. For example, data input bus 406 can carry the value 200, which in the present configuration of CAM array 400 is greater than the lower range boundary of 101, and equal to the upper range boundary 200, and thus inside the range. During the range checking operation, words 410 and 420 each calculate whether the compare data is less than, equal to, or greater than the value stored in each respective word. For example, word 410, storing the value 101 in the present configuration, calculates whether the compare data value 200 is less than, equal to, or greater than the value 101. Word 410 performs this calculation by comparing the four most significant bits of the compare data to the lower range boundary most significant bits in bound check cells 412a through 412d, and simultaneously comparing the four least significant bits of the compare data to the lower range boundary least significant bits in bound check cells 412e through 412h, and then combining the results of each comparison utilizing ripple logics 414a and 414b.

Word 410 compares the four most significant bits of the compare data to the lower range boundary most significant bits stored in bound check cells 412a through 412d one bit at a time. In particular, if the value carried by the bit line of data input bus 406 coupled to bound check cell 412a is equal to the value stored in bound check cell 412a, bound check cell 412a outputs a logical 1 on subsequent match signal Ms 328 to bound check cell 412b. In this circumstance, bound check cell 412b proceeds to compare the subsequent set of most significant bits. However, if the values are not equal, bound check cell 412a outputs a logical 0 on subsequent match signal Ms 328, and also outputs the lower range boundary most significant bit on subsequent bound check signal Qs 326. Bound check cell 412b inputs the logical 0 via previous match signal Mp 324, thereby configuring MUX 318 to pass through the value of previous bound check signal Qp 322, and configuring AND 316 to pass through the logical 0 value of previous match signal Mp 324, to subsequent bound check signal Qs 326.

As stated above, if the value carried on the bit line of data input bus 406 coupled to bound check cell 412a is not equal to the value stored in bound check cell 412a, bound check cell 412a outputs a logical 0 as subsequent match signal Ms 328, and outputs the stored value as subsequent bound check signal Qs 326 to bound check cell 412b. As such, the stored value is acting as a "greater than/less than" flag. For example, in the present configuration, bound check cell 412a stores the most significant bit of the lower range boundary, i.e. stores the bit 0 (101 being 01100101 in binary), and is coupled to the bit line of data input bus 406 carrying the bit 1 (200 being 11001000 in binary). Because the bits 0 and 1 are not equal, bound check cell 412a will output 0 (the stored bit) as subsequent bound check signal Qs 326; the value 0 indicating that 101 (i.e. 01100101) is less than 200 (i.e. 1001000). Bound check cell 412a will also output 0 as subsequent match signal Ms 328, thereby forcing subsequent cascaded bound check cells 412b, 412c, and 412d to pass through the 0 (i.e., the "less than" flag) via subsequent bound check signals 326 to ripple logic 414a.

The inputs of ripple logic 414a corresponding to Qp 322 and Mp 324 are not shown, but are coupled to a default signal set to a logical 1 value. Additionally, the input of ripple logic 414a corresponding to line 320 is coupled to the output of bound check cell 412d corresponding to subsequent bound check signal Qs 326, and the input of ripple logic 414a corresponding to line 321 is coupled to the output of bound check cell 412d corresponding to subsequent match signal Ms 328. Consequently, ripple logic 414a passes through the values on subsequent bound check signal Qs 326 and subsequent match signal Ms 328 of bound check cell 412d, respectively, on subsequent bound check signal 416a and subsequent match signal 418a. Thus, if the four most significant bits of the compare data match the four most significant bits stored in bound check cells 412a through 412d, ripple logic 414a will pass through a logical 1 indicating a match on subsequent match signal 418a. However, if at least one of the four most significant bits mismatch, ripple logic 414a will pass through a logical 0 indicating a mismatch on subsequent match signal 418a, and will pass through a logical value representing a "greater than" or "less than" flag on subsequent bound check signal 416a.

The inputs of ripple logic 414b corresponding to Qp 322 and Mp 324 are coupled, respectively, to subsequent bound check signal 416a and subsequent match signal 418a. Additionally, the input of ripple logic 414b corresponding to line 320 is coupled to the output of bound check cell 412h corresponding to subsequent bound check signal Qs 326, and the input of ripple logic 414b corresponding to line 321 is coupled to the output of bound check cell 412h corresponding to subsequent match signal Ms 328. Consequently, ripple logic 414b passes through the values on subsequent bound check signal 416a and subsequent match signal 418a if subsequent match signal 418a is a logical 0, i.e. if a mismatch occurred comparing the sets of four most significant bits. However, if subsequent match signal 418a is a logical 1, ripple logic 414b passes through the values on subsequent bound check signal Qs 326 and subsequent match signal Ms 328 of bound check cell 412h, respectively, on subsequent bound check signal 416b and subsequent match signal 418b. Thus, subsequent match signal 418b indicates a match if all eight bits of the compare data are equal to the eight bits stored in the bound check cells of word 410. However, if at least one of the eight bits does not match, subsequent match signal 418b indicates a mismatch with a logical 0 value, and subsequent bound check signal 416b indicates either a "greater than" or "less than" flag with a logical 1 or 0 value, respectively.

While the bound check cells and ripple logics of word 410 compare the compare data on data input bus 406 with the lower range boundary, the bound check cells and ripple logics of word 420 perform a similar comparison with the upper range boundary. To conclude the range checking operation, AOI 404 examines the values on subsequent bound check signals 416b and 426b and subsequent match signals 418b and 428b to determine if the compare data is in the range stored in words 410 and 420. In particular, if subsequent match signal 418b has a logical 1 value, then the compare data is equal to the lower range boundary, and is thus in the range. Similarly, if subsequent match signal 428b has a logical 1 value, then the compare data is equal to the upper range boundary, and is thus also in the range. Further, if subsequent match signals 418b and 428b both have a logical 0 value, but subsequent bound check signal 416b has a logical 0 value (i.e., is a "less than" flag) and subsequent bound check signal 426b has a logical 1 value (i.e., is a "greater than" flag), then the compare data is between the lower and upper range boundaries, and is thus in the range. In all three scenarios thus described, AOI 404 will set range check output 408 to logical 1, indicating a range-match. However, if none of the three scenarios thus described occur, then the compare data is out of the range stored in CAM array 400, and AOI 404 will thus set range check output 408 to logical 0, indicating a range-mismatch.

In the manner described above, the present example's CAM array 400 can perform a range checking operation on a single range stored in words 410 and 420, by simultaneously comparing the compare data on data input bus 406 with upper and lower range boundaries stored in the two words and examining the resulting subsequent match signals and subsequent bound check signals. High speed operation is preserved by, for example, utilizing ripple logics to reduce overall delay in cascaded bound check cells. The present invention can be extended to make and operate a range checking CAM array that can perform a range checking operation on multiple ranges by, for example, increasing the number of words in the range checking CAM array. The present invention advantageously has a lower area cost than conventional solutions, because, for example, ranges can be stored in only two words. Additionally, the width of the ranges that can be utilized by the present invention is not disadvantageously limited by the number of words in a particular embodiment of the invention, thereby giving the present invention greater flexibility than conventional solutions.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A range checking CAM (content addressable memory) array comprising:
   a plurality of words;
   each said plurality of words comprising a plurality of bound check cells;
   each said plurality of bound check cells outputting a corresponding plurality of match signals and a corresponding plurality of bound check signals;
   wherein said corresponding plurality of match signals and said corresponding plurality of bound check signals are combined to produce a range check output indicating whether data on a data input bus is within a target range.

2. The CAM array of claim 1, wherein said plurality of bound check cells are coupled in a cascade of bound check cells.

3. The CAM array of claim 1, wherein each said plurality of words further comprises at least one ripple logic.

4. The CAM array of claim 1, wherein each said plurality of words comprises at least one cascade of said plurality of bound check cells terminating at a ripple logic.

5. The CAM array of claim 1, further comprising an AOI logic coupled to at least one of said corresponding plurality of match signals and at least one of said corresponding plurality of bound check signals.

6. The CAM array of claim 5, wherein said AOI logic is configured to produce said range check output.

7. The CAM array of claim 1, wherein said target range is stored in said plurality of words.

8. The CAM array of claim 1, wherein said target range is stored in two words in said plurality of words.

9. A bound checking CAM (content addressable memory) array word, said CAM array word comprising:
   a plurality of bound check cells;
   said plurality of bound check cells outputting a corresponding plurality of match signals and a corresponding plurality of bound check signals.

10. The CAM array word of claim 9, wherein said plurality of bound check cells are coupled in a cascade of bound check cells.

11. The CAM array word of claim 10, wherein said cascade of bound check cells terminate at a ripple logic.

12. The CAM array word of claim 9, further comprising at least one ripple logic.

13. The CAM array word of claim 9, wherein said corresponding plurality of match signals and said corresponding plurality of bound check signals are combined to produce an output indicating whether data on a data input bus is greater than, equal to, or lesser than a stored data.

14. The CAM array word of claim 13, wherein said stored data is stored in said plurality of bound check cells.

15. A bound check cell in a CAM (content addressable memory) array, said bound check cell receiving a previous bound check signal and a previous match signal and a data bit from a data input bus and generating a subsequent match signal and a subsequent bound check signal.

16. The bound check cell of claim 15 further including a ripple logic receiving said previous bound check signal and said previous match signal to generate said subsequent match signal and said subsequent bound check signal.

17. The bound check cell of claim 16 wherein said ripple logic further receives a result of comparing said data bit to a stored bit in said bound check cell to generate said subsequent match signal and said subsequent bound check signal.

18. The bound check cell of claim 16 wherein said ripple logic further receives a stored bit in said bound check cell to generate said subsequent match signal and said subsequent bound check signal.

19. The bound check cell of claim 15, wherein a plurality of said bound check cells are coupled in a cascade of bound check cells in a word in a range checking CAM (content addressable memory) array.

20. The bound check cell of claim 19, wherein said word in said range checking CAM array further comprises at least one ripple logic, wherein said cascade of bound check cells terminate at said ripple logic.

* * * * *